United States Patent [19]

Hshieh et al.

[11] Patent Number: 5,474,943

[45] Date of Patent: Dec. 12, 1995

[54] METHOD FOR FABRICATING A SHORT CHANNEL TRENCHED DMOS TRANSISTOR

[75] Inventors: Fwu-Iuan Hshieh; Mike F. Chang, both of Santa Clara; Hamza Yilmaz, Saratoga, all of Calif.

[73] Assignee: Siliconix incorporated, Santa Clara, Calif.

[21] Appl. No.: 289,358

[22] Filed: Aug. 11, 1994

Related U.S. Application Data

[62] Division of Ser. No. 31,798, Mar. 15, 1993, Pat. No. 5,341,011.

[51] Int. Cl.⁶ ................................................. H01L 21/336
[52] U.S. Cl. ................... 437/40; 437/154; 148/DIG. 103
[58] Field of Search ........................... 437/203, 40, 41, 437/44, 66, 40 DM, 41 DM, 40 RG, 154; 148/DIG. 126, DIG. 103; 257/330, 335

[56] References Cited

U.S. PATENT DOCUMENTS

| | | | |
|---|---|---|---|
| 4,137,109 | 1/1979 | Aiken et al. | 437/66 |
| 4,374,455 | 2/1983 | Goodman | 437/66 |
| 4,398,339 | 8/1983 | Blanchard et al. | 437/66 |
| 4,914,058 | 4/1990 | Blanchard | 437/203 |
| 4,954,854 | 9/1990 | Dhong et al. | 357/23.4 |
| 4,983,535 | 1/1991 | Blanchard | 437/40 |
| 5,072,266 | 12/1991 | Bulucea et al. | 437/38 |
| 5,086,007 | 2/1992 | Ueno | 437/41 |
| 5,168,331 | 12/1992 | Yilmaz | 257/331 |

OTHER PUBLICATIONS

Barbuscia, et al., pp. 757–760, IEDM., Dec. 1984 "Modeling of Polysilicon Dopant Diffusion for Shallow–Junction Bipolar Technology".

S. C. Sun et al., pp. 356–367, IEEE Trans. Electron Devices, vol. ED-27, Feb. 1980 "Modeling of the On–Resistance of LDMOS, VDMOS, and VMOS Power Transistors".

*Primary Examiner*—T. N. Quach
*Attorney, Agent, or Firm*—Skjerven, Morrill, MacPherson, Franklin & Friel; Norman R. Klivans

[57] ABSTRACT

A DMOS transistor having a trenched gate is formed in a substrate such that the P body region of the transistor may be formed heavier or deeper while still maintaining a "short" channel. This is accomplished by forming a portion of the N+ type source region within the P body region prior to forming the trench, followed by a second implantation and diffusion of a relatively shallow extension of the N+ source region formed overlying a part of the P body region. The increased depth or doping concentration of the P body region advantageously lowers the resistance of the P body region, while the short channel lowers the on-resistance of the transistor for improved performance.

6 Claims, 5 Drawing Sheets

METHOD FOR FABRICATING A SHORT CHANNEL TRENCHED DMOS TRANSISTOR

This application is a division of application Ser. No. 08/031,798, filed Mar. 15, 1993, now U.S. Pat. No. 5,341,011.

BACKGROUND OF THE INVENTION

1. Field of the Invention

This invention relates to a rugged DMOS trenched transistor with improved resistance characteristics. More specifically, the invention relates the formation of a "short" channel and increased doping levels to reduce the resistance of the body and on-resistance of the transistor for improved performance.

2. Description of the Prior Art

DMOS (double diffused metal oxide semiconductor) transistors are well known in the art as a type of field effect transistor (FET) where the channel length is determined by the higher rate of diffusion of the P body region dopant (typically boron) compared to the N+ source region dopant (typically arsenic or phosphorous). The channel as defined by the body region overlies a lightly doped drift region. DMOS transistors can have very "short" channels and typically do not depend on a lithographic mask to determine channel length. Such DMOS transistors have good punchthrough control because of the heavily doped P body shield. The lightly doped drift region minimizes the voltage drop across the channel region by maintaining a uniform field to achieve a velocity saturation. The field near the drain region is the same as in the drift region so that avalanche breakdown, multiplication and oxide charging are lessened, compared to conventional MOSFETs.

In one type of such DMOS transistor a "trench" (groove) is used to form the gate structure. These transistors are typically formed on <100> oriented silicon substrates (wafers), using an anisotropic etch to form the trench having sidewalls sloping from the substrate at 54.7°. The doping distribution is the same as in the above described DMOS transistor. The two channels are located one on each side of the etched groove. The device has a common drain contact at the bottom portion of the substrate. Because many devices can be connected in parallel, these transistors can handle high current and high power so are suitable for power switching applications. It is also well known to form such a trenched DMOS device with vertical trench sidewalls formed by isotropic etching, so the trench is rectangular or "U" shaped in cross section.

Often the trench is completely filled with polysilicon which is doped to make it conductive and hence serves as the gate electrode. This also results in the desired planar structure, i.e. having a nearly flat top surface.

A typical prior art trenched DMOS transistor shown in FIG. 14 includes a substrate 62 doped N+, an epitaxial layer 61 formed thereon doped N–, a body region 63 doped P, and a source region 65 doped N+. The gate electrode 69 is conductive polysilicon formed in a trench 66a lined with an oxide gate insulating layer 66. Trench 66a may be U-shaped, or V shaped as shown in FIG. 14. The source contact 67 shorts the body region 63 to the source region 65, and the drain contact 98 is formed on the substrate 62 backside. The channel length is the length of the P body region 63a adjacent to the gate electrode 69. It is to be understood that the structure of FIG. 14 is illustrative; in other devices which are also well known, the trench 66a is filled by the gate electrode 69, thus establishing a planar principal surface.

Although the trenched DMOS transistor has advantages over purely planar FETs, it has several deficiencies. These deficiencies are the on-resistance of the P-body region and the on-resistance of the channel region.

Device ruggedness as determined by the sheet resistance of the N+/P–/N– JFET (parasitic transistor) formed by respectively regions 65/63a/61 will be reduced in order to maintain the same threshold voltage as a planar (non-trenched) DMOSFET. Also, a short channel is difficult to form adjacent a U-shaped trench because a sacrificial oxidation step normally carried out at high temperature to form the trench is followed up by a subsequent trench etching step, which makes the P– body region deeper than desired.

SUMMARY OF THE INVENTION

In accordance with the invention, a trenched gate DMOS transistor is formed in a substrate such that the body region of the transistor may be formed heavier or deeper while still maintaining a "short" channel. The increased depth or doping concentration of the body region advantageously lowers the resistance of the body region and thus improves device ruggedness, while the short channel lowers the on-resistance of the transistor for improved performance.

It is considered important to the performance of such a device that the channel be narrow or "short". The channel region of such a device is in the P body diffusion, so to achieve electron velocity, this region should be kept as "short" as possible. Reducing the length of this P body diffusion does not affect the operating breakdown voltage of the transistor. It is important that the trench extends in depth at least slightly beyond the depth of the adjacent P body region.

Therefore in accordance with the invention, an ion implantation and diffusion process is used to form a portion of the N+ source region within the P body region prior to forming the trench. This N+ source region is implanted using a mask which is then used to etch the trench. In one embodiment, a "deep body" P+ region is also formed within the P body region and spaced apart from the trench walls. Then the trench is lined with a gate oxide layer and filled with doped polycrystalline silicon as the gate electrode. This is followed by formation of a relatively shallow extension of the N+ source region in a part of the P body region. Finally, conventionally an oxide insulating and a metal interconnect layer are formed over the substrate principal surface.

The purpose of the shallow extension N+ source region is twofold. First, this N+ implantation compensates for the doping concentration of the P body region near the channel. Second, a self-aligned short channel is also formed in the process, and threshold voltage determined by P– peak concentration is feasibly adjusted. This short channel is the result of a combination of the N+ doping compensation and boron (P type) diffusion retardation effect.

In addition, the diffusion retardation effect becomes more pronounced when the dose of the N+ shallow extension source region implantation for the channel formation is heavier. Using this effect, desirably a very short channel with improved resistance characteristics is fabricated.

In a second embodiment, a P tub region is formed in the substrate and an N source region formed in the tub. Then the trench is etched through the N source region, the gate electrode formed in the trench, and the P body region formed on either side of the trench. Then an N+ source extension region of arsenic is formed.

In a third embodiment (otherwise like the second embodiment) the N+ source extension region implantation is phosphorous.

It is to be understood that in other embodiments, the conductivity types of the various semiconductor regions are reversed from those described herein.

DETAILED DESCRIPTION OF THE INVENTION

Figure 1:
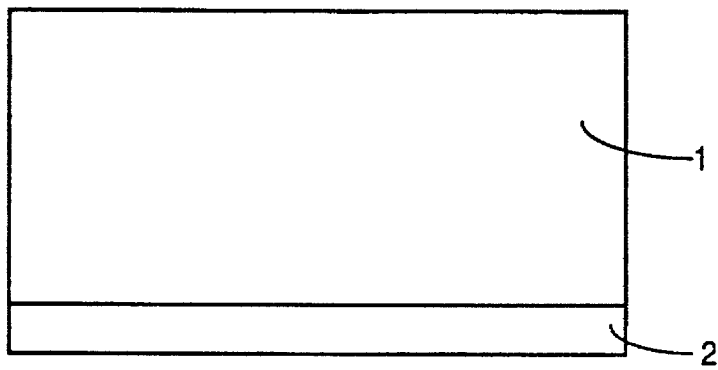
FIGS. 1–8 show process steps for fabrication of a first embodiment with an N+ arsenic source region extension implantation into the source region of the DMOS transistor.

Referring to FIG. 1, an N− epitaxial layer 1 of a first embodiment is shown grown conventionally to a thickness of 5 to 25 μm (1 ∥m=$10^4$ Å) on N+ silicon substrate (drain region) 2. Epitaxial layer 1 has a resistivity in the range of 0.2 to 5.0 Ω-cm.

Figure 2:
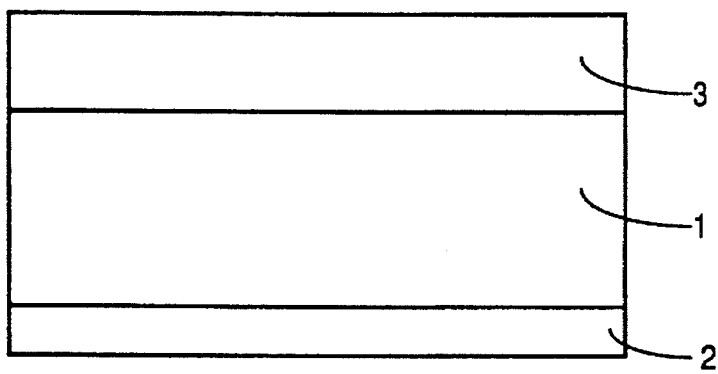

FIG. 2 shows the boron P body 3 implantation (without a mask) and diffusion through a principal surface of the substrate 2. Region 3 is a relatively deep P body region having a final surface doping level of 5E17 to 2E18/$cm^3$ to a depth of 1.0 to 2.0 μm and implanted at a dosage level of 5E13 to 2E14/$cm^2$ and energy level of 30 to 60 KeV. (The notation 5E13 conventionally means $5 \times 10^{13}$).

Figure 3:
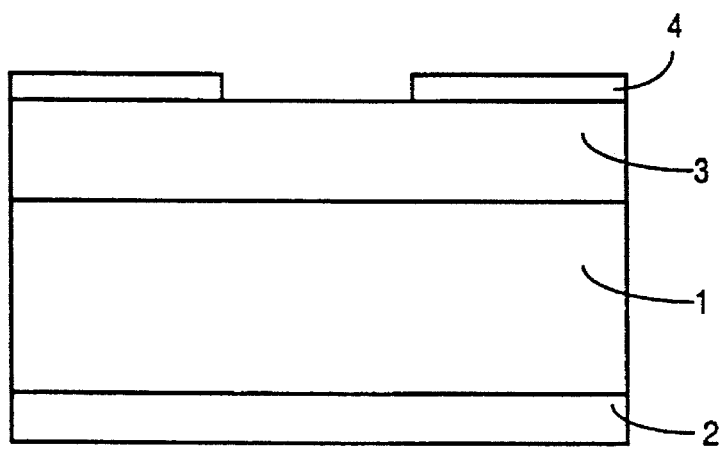

FIG. 3 shows formation of a conventional photolithographic mask layer 4 on the principal surface of the wafer, to be used subsequently for both the N+ source implantation and trench etching. Mask layer 4 is typically oxide 4,000 to 6,000 Å thick.

Figure 4:
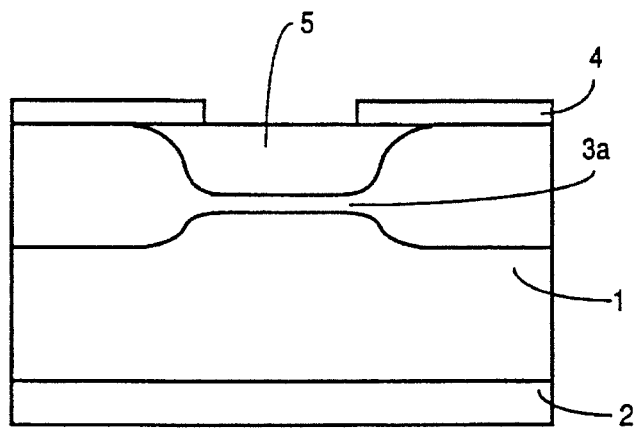

In FIG. 4, a first portion of the arsenic-doped N+ source region 5 is implanted and diffused at a dosage of 3E13 to 1E15/$cm^2$ and energy level of 60 to 80 KeV, to a final surface doping level of 1E18 to 5E19/$cm^3$ and a depth of 0.5 μm to 1.0 μm through the substrate principal surface, as defined by the mask 4. This N+ source region diffusion 5 into P body region 3 results in the depth reduction of about 0.5 to 1.5 μm of a portion of the P body region 3a between the N+ source 5 and the N− epitaxial layer 1. This is known as the boron diffusion retardation effect. (Boron diffusion is slower when arsenic is present.) The purpose of the implanted N+ source region 5 is twofold. First the N+ implantation compensates for the doping concentration of the P body 3a near the channel region. Second, a self-aligned "short" channel is also formed in the process, and threshold voltage determined by P− peak concentration is feasibly adjusted. This "short" channel is the result of a combination of the N+ source 5 doping compensation and boron diffusion retardation effect due to the presence of arsenic from the source diffusion 5 implant.

Figure 5:
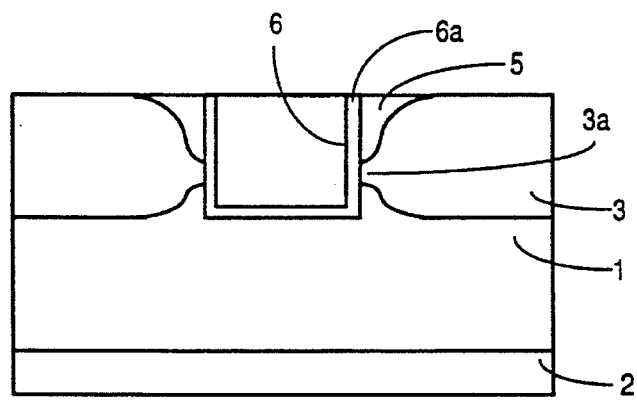

FIG. 5 shows the formation of the U-shaped (rectangular) trench 6 to a depth of 1.0 to 6.0 μm and width of 1.0 to 3.0 μm through the N+ source layer 5, the shallow portion of the P body region 3a, and into N− region 1. Trench 6 formation is accomplished typically by a conventional isotropic etching process through the principal surface using the mask 4 which is then stripped off. Trench 6 is then conventionally lined with gate oxide layer 6a having a thickness of 500 to 1000 Å, after removal of mask 4.

Figure 6:
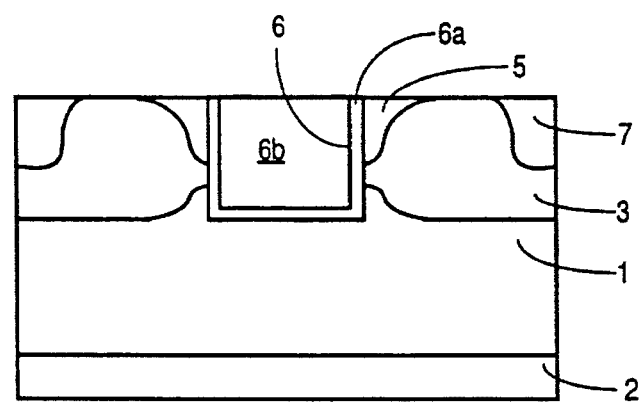

Then in FIG. 6, trench 6 is conventionally filled with doped (conductive) polycrystalline silicon 6b doped to a resistance of 20 to 25 Ω per square. A boron P+ deep body region 7 is then implanted and diffused using a P+ region mask through the principal surface into the P body region 3 at a dosage of 1E15 to 1E16/$cm^2$ and an energy level of 20 to 40 KeV, to form a final junction depth of 0.5 to 1.0 μm and a final surface doping level of 1E19 to 1E20/$cm^3$. P+ region 7 is disposed within the P body region 3, spaced from the trench 6 and the first portion of the N+ region 5 but still fairly close by, being spaced 1.0 μm from trench 6 and 0.5 μm from N+ region 5.

Figure 7:
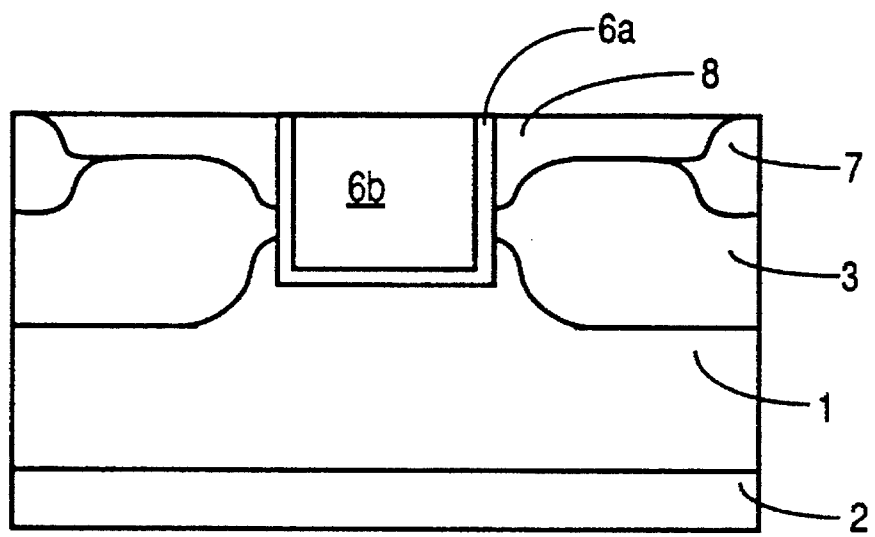

FIG. 7 shows a shallow arsenic implantation and diffusion using the source extension region mask of a source extension region 8 of the N+ source region 5 through the principal surface, in a direction away from the trench over the P body 3, and laterally into the P+ deep body region 7. Region 8 is formed to a depth of 0.3 to 0.5 μm at a dose of 5E15 to 8E15/$cm^2$ and energy level of 60 to 80 KeV, and to a width of 1.0 to 2.0 μm. In another embodiment, the source extension region 8 is formed prior to etching of the trench.

Figure 8:
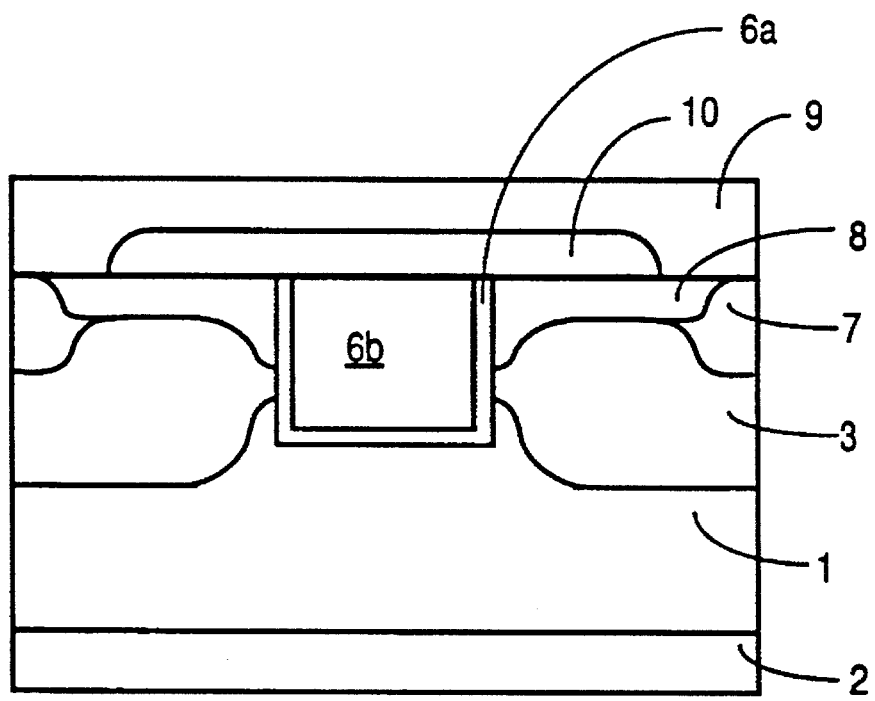

Finally, FIG. 8 shows conventional formation of the oxide insulating layer 10 and metal interconnection layer 9 over the principal surface to complete the trenched DMOS transistor.

In this embodiment, the boron diffusion retardation effect is more pronounced due to a heavier (greater than 10 times heavier) dose of implanted arsenic for region 8 vs. region 5, for the "short" channel formation. Using this effect, a very desirably "short" channel with improved resistance characteristics is fabricated. In addition, ruggedness of this device is good, because the P body region 3 is closer to the channel, resulting in lower parasitic resistance in P body region 3.

The top side geometry of the trench is any shape such as square, linear, circular, or hexagonal.

Figure 9:
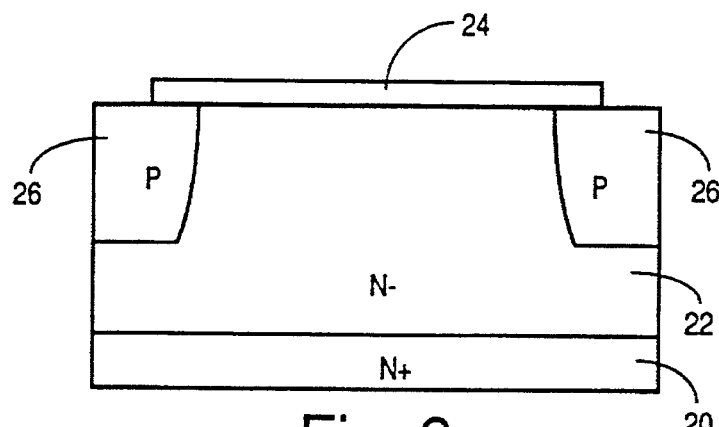
FIGS. 9 to 12 show process steps for a second embodiment with an N arsenic source region extension implantation into the source region of the DMOS transistor.

An alternative set of process steps for a second embodiment is shown in FIGS. 9 to 12. In FIG. 9 an N+ substrate 20 on which N− epitaxial layer 22 has been grown is masked by oxide mask layer 24 and a P tub 26 of boron implanted and diffused to a depth of 1 to 3 μm and final surface doping level of 3E15 to 1E18/$cm^2$ using a dose of 1E13 to 1E14/$cm^2$ at 40 to 60 KeV.

Figure 10:
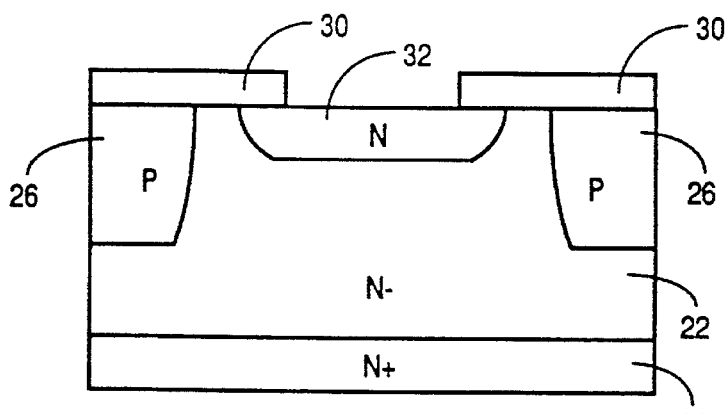

Then in FIG. 10 after diffusion of P tub 26, trench oxide mask layer 30 is conventionally formed and either an arsenic or phosphorous N source region 32 implanted and diffused to a depth of 0.5 to 1.5 μm and final surface doping level of 1E18 to 5E18 at a dose of 3E13 to 2E14 at 60 to 80 KeV.

Figure 11:
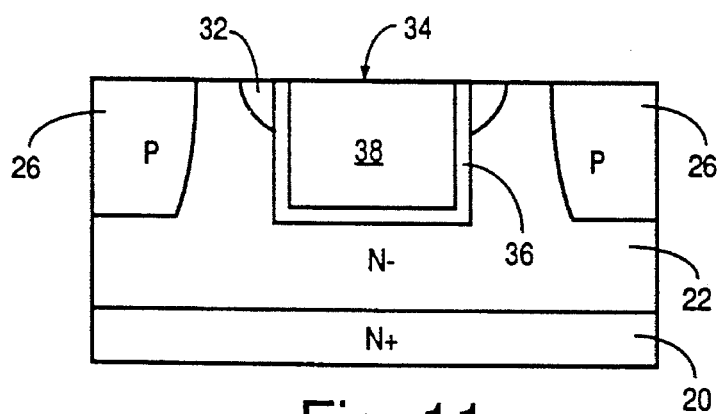

Then in FIG. 11 the trench 34 is isotopically etched through mask layer 30. Then trench mask layer 30 is stripped off, and a conventional gate oxide 36 grown on the sidewalls of trench 34. Then trench 34 is conventionally filled with doped polycrystalline silicon 38 serving as a gate electrode.

Figure 12:
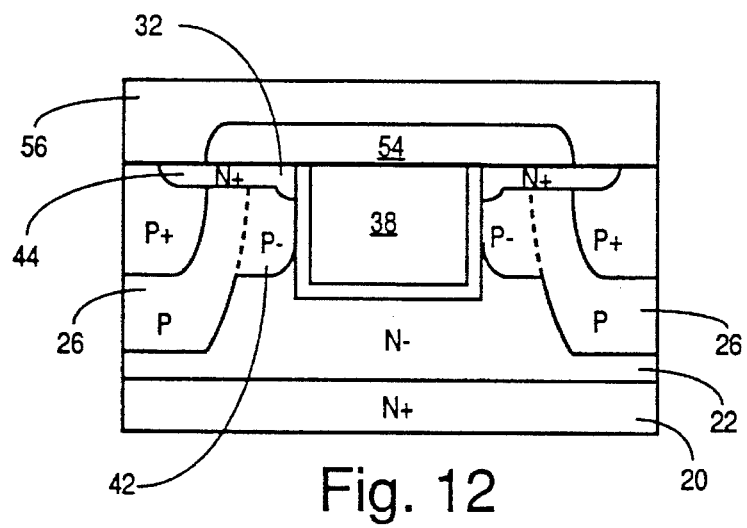

Then in FIG. 12, P-body region 42 is implanted and diffused to a depth of 0.8 to 1.5 μm and final surface doping level of 5E17 to 2E18/$cm^3$ at 20 to 60 KeV and a dose of 3E13 to 2E14/$cm^2$. Then N+ source extension region 44 is arsenic implanted and either diffused or not diffused to a depth of 0.3 to 0.5 μm and a final surface doping level of 4E19 to 6E19/$cm^3$ using a dose of 8E15 to 1E16/$cm^2$ at 60 to 80 KeV. Thus in the embodiment of FIG. 12, a "short" channel is formed by a combination of doping compensation with a medium dose of arsenic (N) implantation for the source extension region and boron (P) diffusion retardation effect. In this embodiment, the boron diffusion is slower since arsenic is present.

Figure 13:
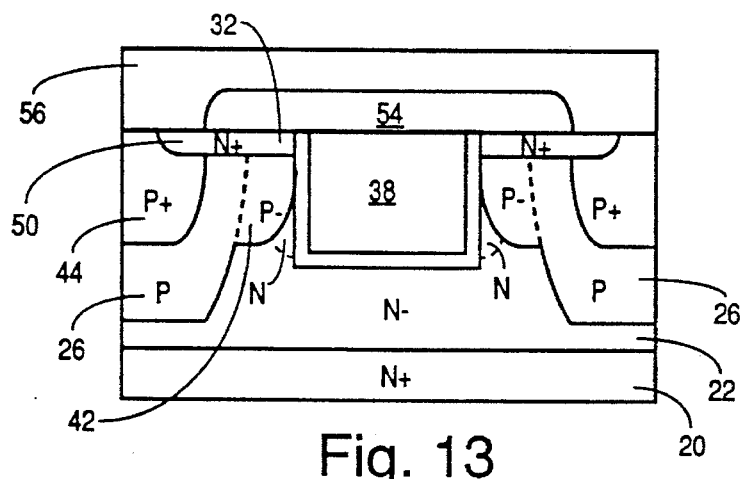
FIG. 13 shows a third embodiment with a phosphorous implant into the source region of the DMOS transistor.
Figure 14:
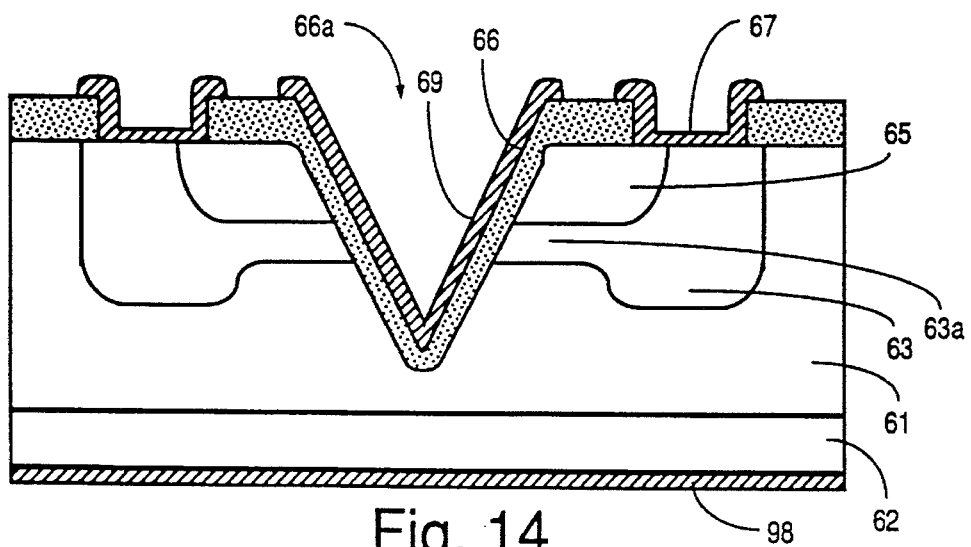
FIG. 14 shows a prior art trenched DMOS transistor.

Alternatively to FIG. 12, in another embodiment in FIG. 13 instead of the N+ source extension 50 being arsenic, it is instead phosphorous implanted and diffused to a depth of 1.0 to 1.5 µm and a final surface doping level of 1E17 to 1E18/cm$^3$ at 60 to 80 KeV and a dose of 1E13 to 1E14/cm$^2$. FIG. 13 thus shows the third embodiment of the trenched DMOS transistor, using a phosphorus (N) source extension region implantation in the trench area (instead of arsenic), wherein an even "shorter" channel is formed because phosphorus diffuses faster than arsenic.

Thus for the processes of FIGS. 9 to 12 and 13, in one embodiment seven masks are used: P tub, trench, P+ diffusion, N+ diffusion, contact openings, metal, and bonding pad openings (the latter three steps being conventional and not illustrated).

Both the transistors of FIGS. 12 and 13 are conventionally completed with an oxide insulating layer 54 and metallization layer 56. The peak dopant concentration of the P body regions in the structures of FIGS. 8, 12, and 13 is the same to maintain the same threshold voltage.

Although the invention has been described in terms of specific embodiments for illustrative purposes, it will be appreciated by one skilled in the art that numerous modifications are possible without departing from the scope and spirit of the invention as defined in the claims.

We claim:

1. A method of forming a field effect transistor from a substrate of a first conductivity type comprising the steps of:
   forming a body region of a second conductivity type extending into the substrate from a principal surface of the substrate;
   forming a source region of a first conductivity type extending into the substrate from the principal surface of the substrate and being of a higher doping concentration than the substrate, the source region being laterally defined by a mask and shallower than the body region with respect to the principal surface;
   forming at least one trench in the substrate extending into the substrate from the principal surface, the trench being laterally defined by the same mask and being deeper than the body region with respect to the principal surface; and
   after the step of forming the trench reforming the source region by forming an extended portion of the source region laterally along the principal surface of the substrate on either side of the trench, the reformed source region being shallower than the body region with respect to the principal surface and wherein the extended portion of said source region is shallower with respect to the principal surface than a portion of the source region immediately adjacent to the trench, and wherein the step of forming the extended portion of the source region causes diffusion retardation of the body region, thereby shortening a channel length of the transistor.

2. The method of claim 1, wherein a portion of the body region immediately adjacent to the trench has an edge which is sloping such that a portion of the edge immediately adjacent the trench is shallower with respect to the principal surface than is another edge portion of the body region away from the trench.

3. The method of claim 1, further comprising forming a deep body region of second conductivity type extending from a principal surface of the substrate and being of a higher doping concentration than the body region, the deep body region being disposed away from the trench and substantially within the body region.

4. The method of claim 1, further comprising the step of forming a deep body region of the second conductivity type and lying within the body region, and spaced from the trench.

5. The method of claim 1, further comprising the step of forming a deep body region of second conductivity type extending from a principal surface of the substrate and being of a higher doping concentration than the body region, the deep body region being disposed away from the trench and within the body region.

6. A method of forming a field effect transistor from a substrate of a first conductivity type comprising the steps of:
   forming a tub region of a second conductivity type extending into the substrate from a principal surface of the substrate;
   forming a source region of a first conductivity type extending into the substrate from the principal surface of the substrate and being of a higher doping concentration than the substrate, the source region being laterally defined by a mask;
   forming at least one trench in the substrate extending into the substrate from the principal surface, the trench laterally defined by the same mask and being deeper than the source region with respect to the principal surface;
   forming a body region of the second conductivity type extending from the principal surface of the substrate and being of less depth than the tub region; and
   after the step of forming the trench reforming the source region by forming an extended portion of the source region laterally along the principal surface of the substrate on either side of the trench, the reformed source region being shallower than the body region with respect to the principal surface and wherein the extended portion of said source region is shallower with respect to the principal surface than is a portion of the source region immediately adjacent to the trench, and wherein the step of forming the extended portion of the source region causes diffusion retardation of the body region, thereby shortening a channel length of the transistor.

* * * * *

UNITED STATES PATENT AND TRADEMARK OFFICE
CERTIFICATE OF CORRECTION

PATENT NO. : 5,474,943
DATED : December 12, 1995
INVENTOR(S) : Hshieh et al.

It is certified that error appears in the above-identified patent and that said Letters Patent is hereby corrected as shown below:

At column 3, line 25, delete "∥" and substitute --$\mu$--.

Signed and Sealed this

Sixth Day of August, 1996

BRUCE LEHMAN

*Attest:*

*Attesting Officer*     Commissioner of Patents and Trademarks